(12) United States Patent
Terranova

(10) Patent No.: US 7,978,112 B2
(45) Date of Patent: Jul. 12, 2011

(54) FLASH CONVERTER DIFFERENTIAL REFERENCE LADDER ADJUSTMENT WITH STABLE COMMON MODE VOLTAGE

(75) Inventor: Domenic F. Terranova, North Andover, MA (US)

(73) Assignee: Kenet, Inc., Woburn, MA (US)

( * ) Notice: Subject to any disclaimer, the term of this patent is extended or adjusted under 35 U.S.C. 154(b) by 17 days.

(21) Appl. No.: 12/330,224

(22) Filed: Dec. 8, 2008

(65) Prior Publication Data
US 2009/0146859 A1  Jun. 11, 2009

Related U.S. Application Data

(60) Provisional application No. 61/005,732, filed on Dec. 7, 2007.

(51) Int. Cl.
*H03M 1/12* (2006.01)
(52) U.S. Cl. ........................... 341/155; 341/120
(58) Field of Classification Search .................. 341/155, 341/161, 120, 154, 136, 126, 150
See application file for complete search history.

(56) References Cited

U.S. PATENT DOCUMENTS

| 6,882,294 B2* | 4/2005 | Linder et al. ............... 341/154 |
| 6,989,778 B2* | 1/2006 | Clara et al. ............... 341/143 |
| 7,023,147 B2* | 4/2006 | Colby et al. ............... 315/291 |
| 7,061,419 B2* | 6/2006 | Sushihara et al. ............... 341/155 |

* cited by examiner

*Primary Examiner* — Joseph Lauture
(74) *Attorney, Agent, or Firm* — Hamilton, Brook, Smith & Reynolds, P.C.

(57) ABSTRACT

An adjustment circuit for use with a resistive reference ladder that establishes nominal reference steps and a common mode voltage for a plurality of comparators, such as used in a flash converter. An "H" arrangement of current sources injects current at a first node, $V_H$, and sinks at a second node, $V_L$, with $V_H$ and $V_L$ being coupled to ends of the ladder. The voltage difference between these two nodes thus controls the scale applied to the reference ladder, without affecting a common mode voltage reference Vcm. Alternatively, the current source may inject current at $V_L$ and sink current at $V_H$ to decrease the reference for each comparator.

15 Claims, 5 Drawing Sheets

US 7,978,112 B2

FLASH CONVERTER DIFFERENTIAL REFERENCE LADDER ADJUSTMENT WITH STABLE COMMON MODE VOLTAGE

RELATED APPLICATION(S)

This application claims the benefit of U.S. Provisional Application No. 61/005,732 filed on Dec. 7, 2007. The entire teachings of the above application(s) are incorporated herein by reference.

BACKGROUND OF THE INVENTION

In applications where a differential flash converter is part of a larger system, it may be necessary to adjust the scale factor of a reference ladder to compensate for other components in the system.

SUMMARY OF THE INVENTION

In a preferred embodiment, an arrangement of amplifiers and current sources are connected to a resistive ladder, to provide an adjustment range to a differential reference ladder with minimal disturbance of its common mode voltage. The reference ladder can be used in a differential flash converter or in other end uses.

The ladder relies solely on the ratio of resistances to establish the nominal reference steps and a common mode voltage for the flash comparators.

An "H" arrangement of current sources is used to inject current at a first node, VH, and to sink at a second node, VL. The voltage difference between these two nodes controls the scale applied to the reference ladder. Alternatively, the current source may inject current at VL and sink current at VH to decrease the reference for each comparator.

A differential amplifier controls the direction and magnitude of the adjustment current. The invention therefore provides a relatively wide reference wide ladder adjustment range (of +/−30%) while protecting downstream circuit elements from errors due to common mode voltage sensitivity.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

A description of example embodiments of the invention follows.

In some applications, a flash converter can be a component of a larger system. One such application, such as an N-bit pipelined Analog to Digital (A-D) converter, uses several flash converter stages. The flash converter stages use resistive ladders to provide reference voltages to an array of comparators. In this application it may be necessary to match parts of the system that are upstream of a particular stage, e.g., the N-M bit flash converter.

Thus, it becomes desirable to allow for adjustment of the scale factor of a resistive ladder under control of upstream components, for several reasons. Controlled variance of the scale factor may be used to match the scale of a flash converter to the scale of the other components, such as previous stages in a pipeline A/D converter. Furthermore, in some applications, it may be desirable to adjust the ladder scale factor without affecting the common mode voltage of the ladder.

Figure 1:
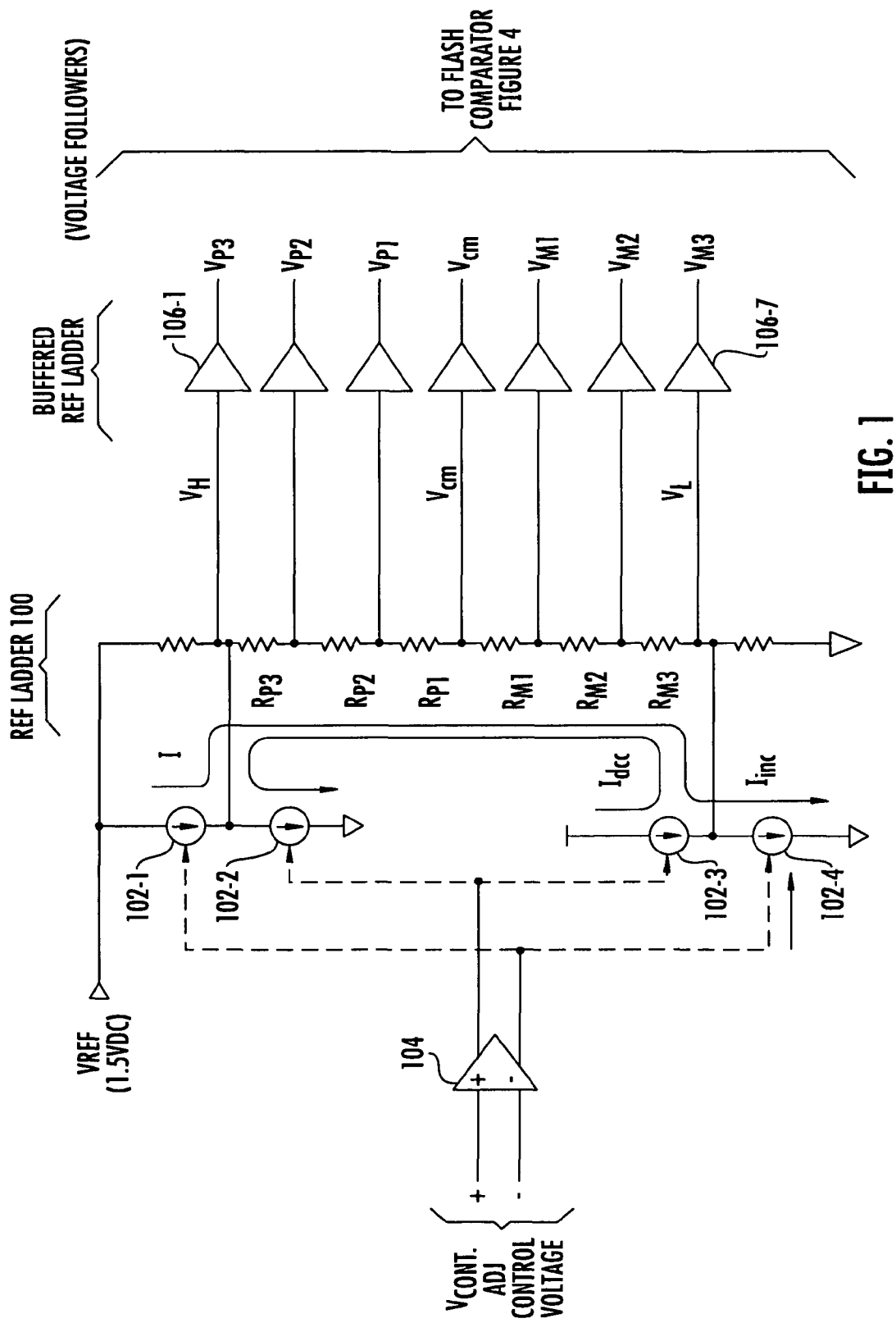
FIG. 1 is simplified diagram of a resistive ladder circuit and associated scale control.

A simplified version of a ladder circuit that can be used in a preferred embodiment is shown in FIG. 1. The reference ladder 100 includes a number of resistive elements Rp3, Rp2, Rp1, Rm1, Rm2, Rm3 that provide an array of output voltages Vp3, Vp2, Vp1, Vcm, Vm1, Vm2, Vm3 at the output of respective voltage follower buffers 106. This particular reference ladder 100 can thus provide seven different reference voltages. In an embodiment used to implement a flash A/D converter, the reference voltages are fed to a set of flash comparators (not shown in FIG. 1) that compare an input signal to the reference voltages to provide the analog to digital conversion result.

An array of voltage controlled current sources 102-1, 102-02, 102-3, 102-4 is used to scale the output range, either by forcing more current (sinking less current) into resistor ladder Rp3 . . . Rm3, thus increasing the differential voltage of (Vp3−Vm3), or sinking more current (sourcing less current) through resistor ladder Rm3 . . . Rp3, thus decreasing the differential voltage (Vp3−Vm3). The sign and magnitude of this adjustment is determined by an adjustable control voltage input Vcont. Note that the adjustable control voltage Vcont may be provided as a differential voltage by a differential input buffer 104.

In one specific embodiment, the common mode voltage Vcm at the output may be specified to change over a range limited to +/−5 millivolts (mV) while allowing an adjustment of a least significant bit (LSB) value over a range of plus or minus 30%. In the example of FIG. 1 for a seven comparator circuit, a voltage range (VH-VL) may thus nominally represent a nominal +86 millivolts, and (VL-VH) may represent −86 mV.

Figure 2:
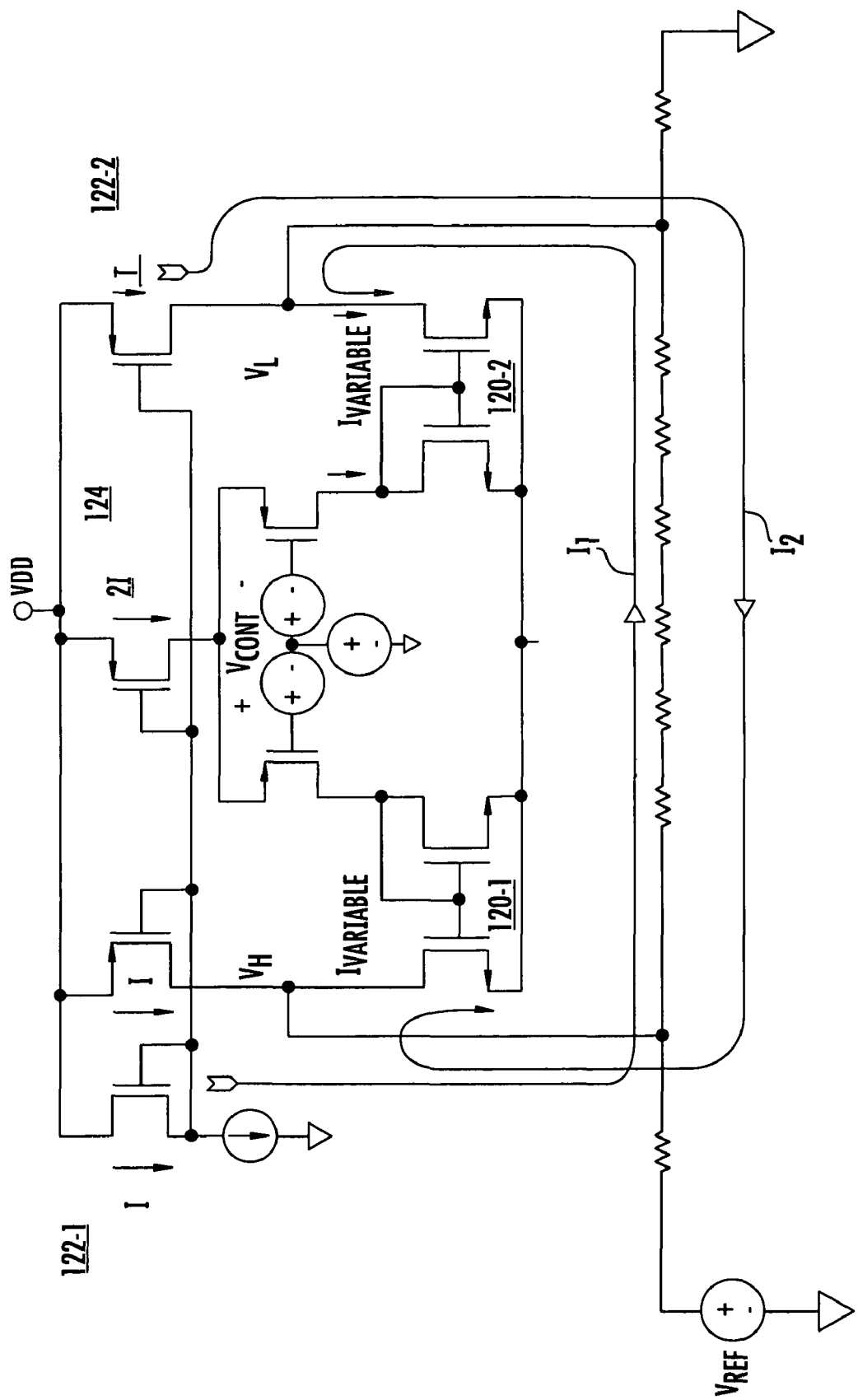
FIG. 2 is a more detailed view of the scaling circuit.

A circuit which may be used to implement the adjustments to the resistive ladder scale is shown in more detail in FIG. 2. Here, a variable current source amplifier pair 120-1 or 120-2 are used bleed current off one side or the other of a differential current source (provided by the upper amplifiers 122-1, 122-2, 124), depending on the sign of the Vcont input. This results in adjustment of the current that can flow in either direction (as illustrated by the current path arrow $I_1$ and current path arrow $I_2$ through the ladder. More particularly, when Vcont is positive, current source pair 120-1 is active, causing current $I_1$ to flow, and when Vcont is negative, current source pair 120-2 is active causing current $I_2$ to flow.

Figure 3:
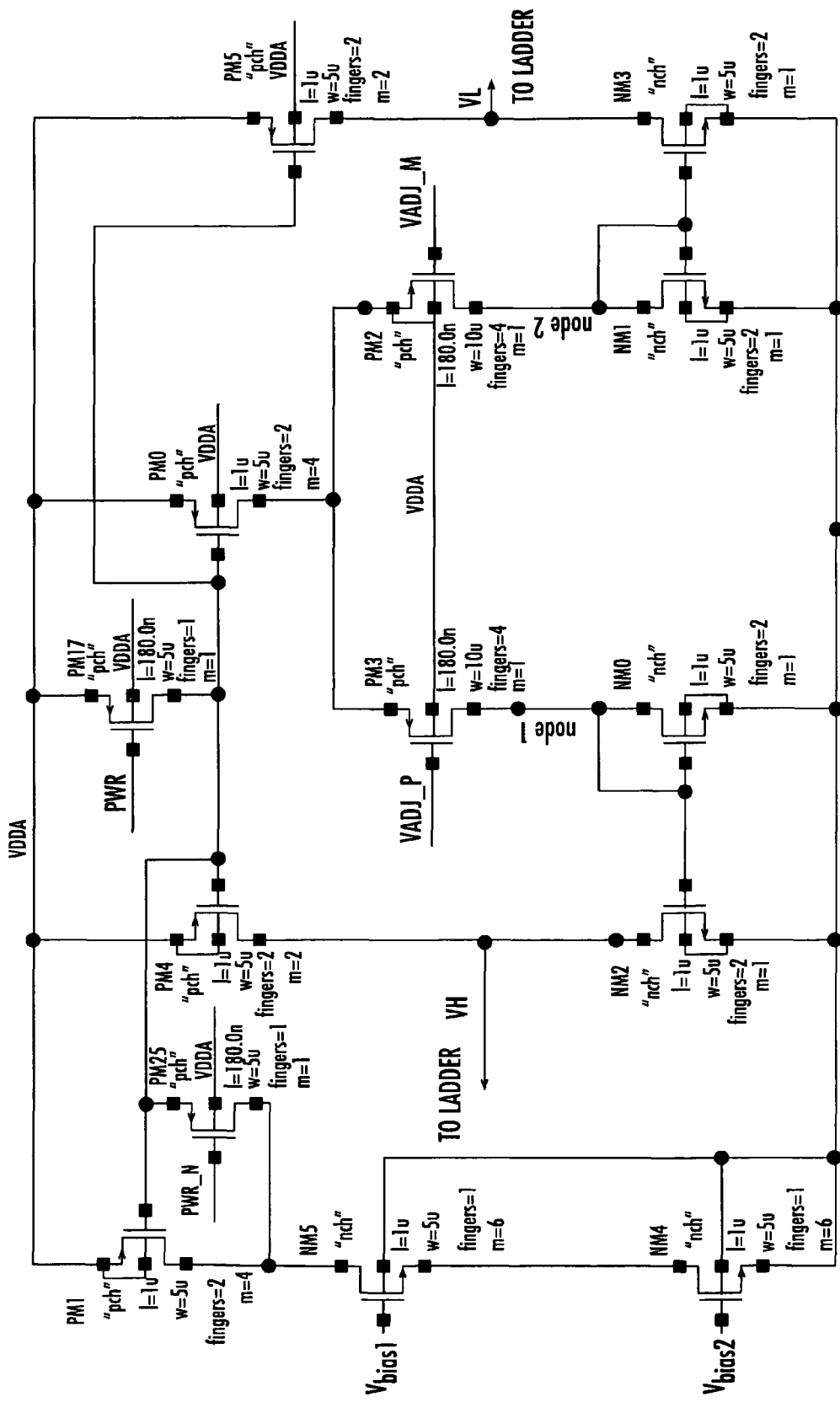
FIG. 3 is a circuit diagram that illustrates the current source and current sinks in more detail.

FIG. 3 is a more detailed view of one preferred implementation of the ladder adjustment circuit. Here the Vcont inputs are provided, respectively, as the "plus" and "minus" differential input terminals VADJ_P and VADJ_M. The inputs are fed to a respective differential pair of FETs, PM3 and PM2. FET PM0 provides as a common tail current source for the input differential pair.

Acting with respective FETs PM3 and PM2, FETs NM0 and NM1 provide controllable current sinks that can be altered to vary the desired output at nodes VH and VL. PM4 and PM5 provide constant current sources to each respective side—PM4 and PM5 are active all the time, sourcing a given current.

The differential voltage between VADJ_P and VADJ_M thus controls the amount of current flowing through either NM2 or NM 3.

Other transistors, such as PM25 and PM17, can be used to control power applied to this circuit.

Thus it is now understood how a scale factor of a flash converter reference ladder may be changed. Furthermore, it is possible to adjust the ladder scale factor without adversely affecting the value of a common low voltage Vcm of the reference ladder.

Figure 4:
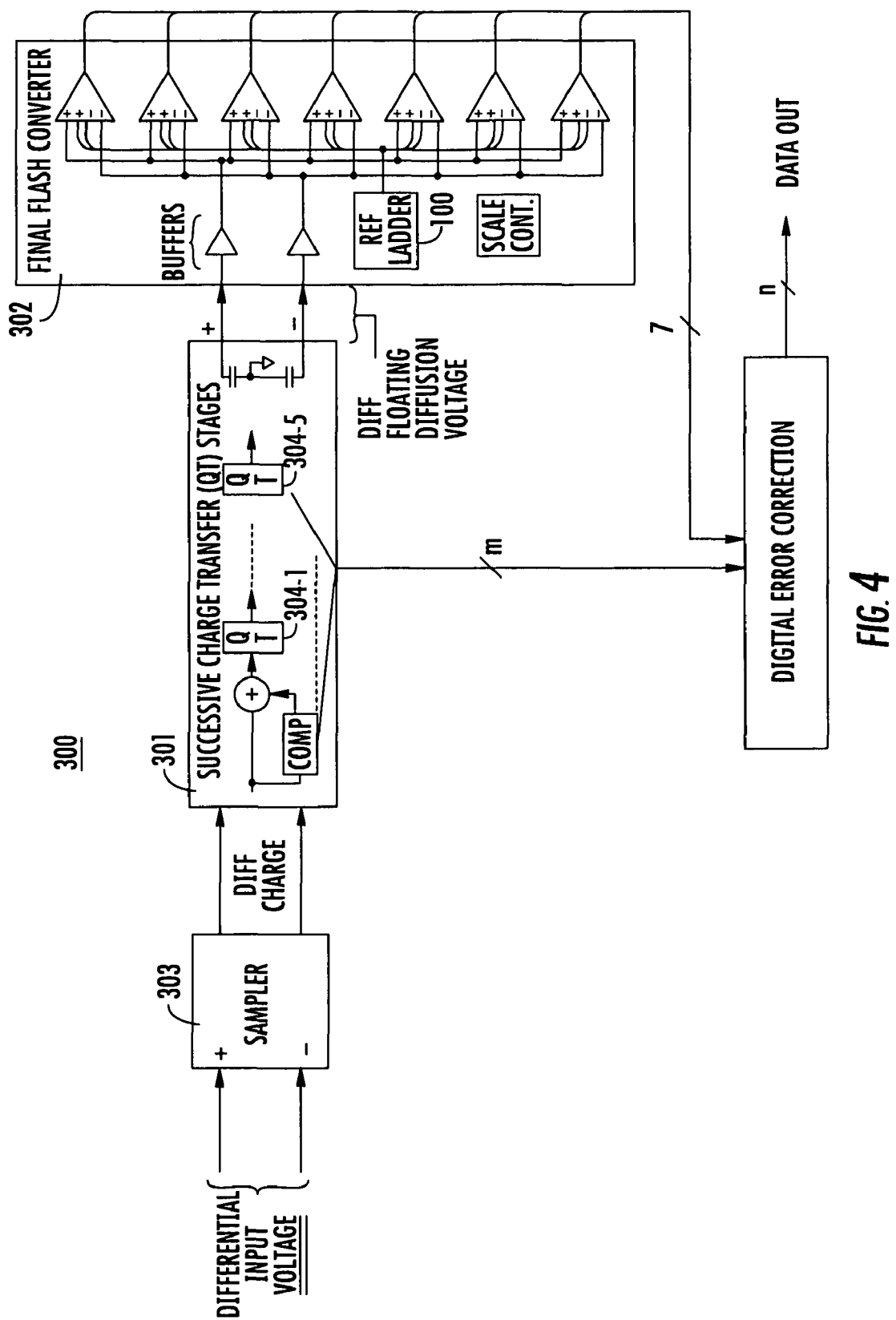
FIG. 4 is a block diagram illustrating use of the ladder circuit and scale control as used in a flash converter portion of a charge domain pipeline A/D converter.

FIG. 4 is a high level block diagram of a charge domain pipelined A/D converter 300 that may be implemented using the resistive ladder and scale adjustment circuits of FIGS. 1, 2 and 3. The pipelined converter 300 consists of a successive-type A/D portion 301 and a flash-type A/D portion 302. The first portion 301 provides "m" of the desired "n" total output bits, and the second portion 302 provides the rest. For example, using the circuits of FIGS. 1, 2 and 3, the flash produces 7 of the n final digital output bits of the A/D converter (e.g., the 7 bits of the flash may not appear "one for one" in the n bits of the output).

More particularly, a differential input voltage sampler 303 provides differential charge signals to the successive-type A/D portion 301 which includes a number of successive charge transfer stages 304-1, . . . 304-s (Qt) arranged in a pipeline to provide the operations needed to carry out charge-domain Analog to Digital conversion: namely charge storage and transfer, charge comparison, and conditional and constant charge addition. These operations can be combined in various ways to carry out a variety of A/D algorithms, which may for example, carry out 1-bit, 1½ bit, 2 bits per stage or in other configurations as described in a co-pending U.S. Patent Publication No. 2008/0246646 entitled "Charge Domain Pipeline Analog to Digital Converter", U.S. Patent Publication filed Jan. 18, 2008, which is incorporated by reference herein. What is important to note here is that the flash-type A/D portion 302 can make use of adjustment of the scale factor applied to a voltage ladder according to the principals of FIGS. 1, 2 and 3 as explained above.

Figure 5:
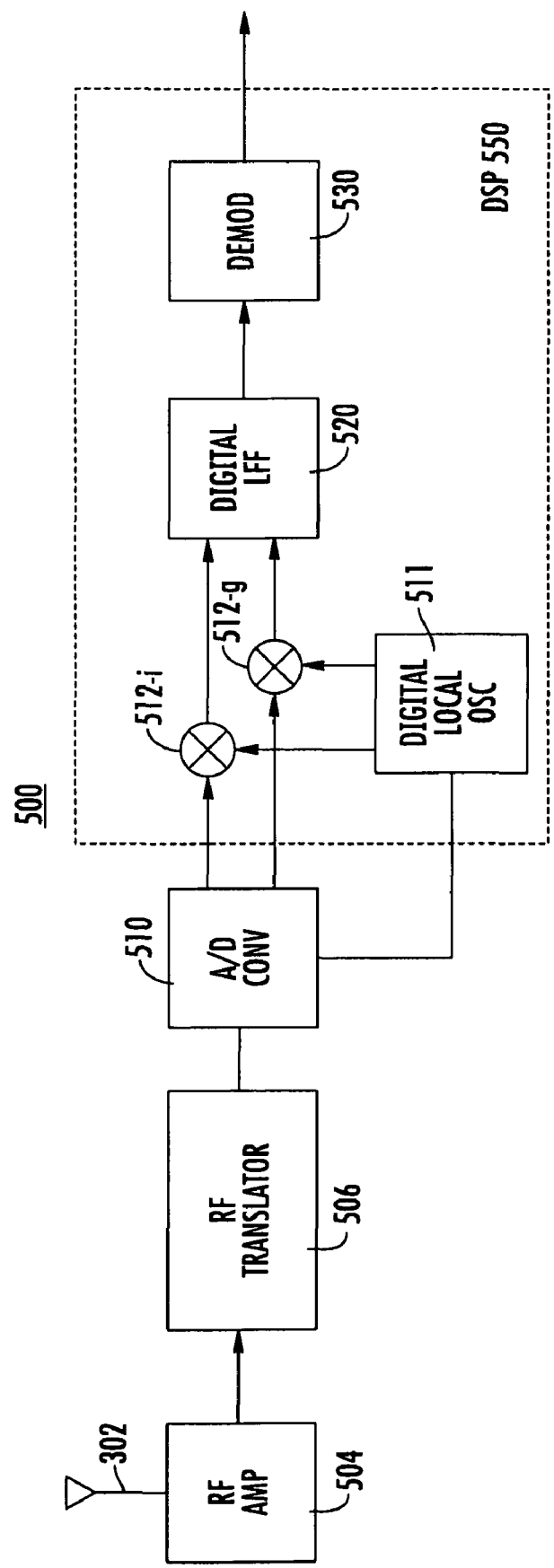
FIG. 5 illustrates an example application of the A/D converter such as in a digital radio frequency signal receiver.

One particular use of the corresponding charge domain pipeline A/D is to implement a digital radio receiver, as generally shown in FIG. 5. A radio frequency (RF) signal is fed to a radio frequency RF amplifier 504. In a wireless application, the RF signal may be received from an antenna 502; in other applications it may be received via a wire. The amplified RF signal is then fed to an RF translator 506 to down-convert the amplified RF signal to an intermediate frequency (IF). After the RF translator 506 (which may be optional) the ADC 510 is then used to digitize the RF input into digital samples for subsequent processing. A digital local oscillator 511 may operate digital mixers 512-$i$ and 512-$q$ to provide for in phase and quadrature samples thereof. A digital low pass filter 520 limits the frequency content of resulting signal to the desired bandwidth. A demodulator 530 then recovers the original modulated signal from the same using. One or more of the operations of the digital local oscillator 511, mixers 512, low pass filter 520 and/or demodulator 530 may be implemented in a digital signal processor 550. The recovered signal may then be further processed converted back to an analog baseband signal or the like, depending on the specific end application of the digital receiver.

While this invention has been particularly shown and described with references to example embodiments thereof, it will be understood by those skilled in the art that various changes in form and details may be made therein without departing from the scope of the invention encompassed by the appended claims.

What is claimed is:

1. A scaling circuit for use in a flash converter comprising:
   a resistive reference ladder, arranged to provide a plurality of reference steps and a common mode voltage;
   a plurality of output buffers, each coupled to a respective one of the reference steps and common mode voltage; and
   two differential pairs of current sources, each responsive to an input common mode voltage adjust signal, for adjusting an amount of current and a direction of current that is sourcing or sinking through the reference ladder.

2. The apparatus of claim 1 wherein one current source in each of the two pairs of current sources is an adjustable current source responsive to the input common made voltage adjust signal, and the other current source in each of the two pairs of current sources is a constant current source.

3. The apparatus of claim 1 wherein a common tail current source is coupled to the input adjust signal.

4. The apparatus of claim 1 wherein the output buffers are connect to a set of comparators to provide a flash-type analog to digital converter having an output representative of the input signal sample.

5. The apparatus of claim 4 wherein the analog to digital converter is part of a digital radio frequency receiver.

6. The method of claim 1 additionally comprising:
   providing a flash-type analog to digital conversion output by connecting the output buffers to a set of flash comparators to provide an output representative of the input signal sample.

7. The method of claim 6 wherein the analog to digital conversion result is part of a digital radio frequency receiver.

8. A method comprising:
   providing a plurality of reference step voltages and a common mode voltage from a resistive reference ladder;
   buffering each of the reference step voltages and common mode voltage;
   adjusting an amount of current that is sourcing through the reference ladder, using a pair of current sources and a pair of current sinks that are each responsive to an input common mode adjust signal.

9. The method of claim 8 additionally comprising:
   controlling direction of current flow through the resistive ladder with a second pair of current sources.

10. The method of claim 9 additionally comprising:
    adjusting a current source in each of the two pairs of current sources responsive to the input adjust signal; and
    holding another current source in each pair as a constant current source.

11. The method of claim 8 additionally comprising:
    adjusting current flow through the resistive ladder without affecting a common mode reference voltage output by the ladder.

12. The method of claim 8 additionally comprising;
    applying the input adjust signal as a differential voltage that controls an amount of current and the direction of current through the resistive ladder.

13. The method of claim 12 additionally comprising:
    coupling the input adjust signal to a common tail current source.

14. A flash analog to digital converter comprising:
    a resistive reference ladder, arranged to provide a plurality of reference steps and a common mode voltage;
    a plurality of output buffers, each coupled to a respective one of the reference steps and common mode voltage;

an array of flash comparators, each having an first input coupled to receive an input signal to be converted and a respective output buffer, to provide an analog to digital converter bit output; and two differential pairs of current sources, each responsive to an input common mode adjust signal, for adjusting an amount of current that is sinking and/or sourcing through the reference ladder.

15. A method for providing a flash analog to digital conversion output comprising:

providing a plurality of reference voltage steps and a common mode voltage at the output of a resistive reference ladder;

buffering each respective one of the reference steps and common mode voltage;

flash converting an input signal, by coupling the input signal to a first input of each of an array of flash comparators, each flash comparator also connected to an output of a respective buffering step, to provide an analog to digital converter bit output; and adjusting an amount of current that is sinking or sourcing through the reference ladder using a pair of current sources and a pair of current sinks, and responsive to an input common mode adjust signal.

* * * * *